United States Patent
Webb et al.

(10) Patent No.: US 6,762,464 B2
(45) Date of Patent: Jul. 13, 2004

(54) N-P BUTTING CONNECTIONS ON SOI SUBSTRATES

(75) Inventors: Clair Webb, Aloha, OR (US); Mark Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/245,933

(22) Filed: Sep. 17, 2002

(65) Prior Publication Data

US 2004/0051144 A1 Mar. 18, 2004

(51) Int. Cl.$^7$ .............................................. H01L 27/01
(52) U.S. Cl. ........................ 257/377; 257/347; 257/351; 257/370; 257/371
(58) Field of Search ................................. 257/347–360, 257/370, 371, 377, 764, 766

(56) References Cited

U.S. PATENT DOCUMENTS

| | | | |
|---|---|---|---|
| 5,818,076 A | * 10/1998 | Zhang et al. | |
| 5,943,559 A | * 8/1999 | Maeda | 438/149 |
| 6,004,878 A | * 12/1999 | Thomas et al. | |
| 6,117,762 A | 9/2000 | Baukus et al. | |
| 6,219,114 B1 | * 4/2001 | Lyu | 349/43 |
| 6,242,779 B1 | * 6/2001 | Maekawa | |

* cited by examiner

Primary Examiner—Fetsum abraham
(74) Attorney, Agent, or Firm—Blakely, Sokoloff, Taylor & Zafman LLP

(57) ABSTRACT

An SOI connection for connecting source/drain regions of one transistor to source/drain regions of another transistor without the use of overlying metal. The regions abut, and a salicide interconnects the regions.

17 Claims, 4 Drawing Sheets

US 6,762,464 B2

N-P BUTTING CONNECTIONS ON SOI SUBSTRATES

FIELD OF THE INVENTION

This invention relates to the field of integrated circuits formed on silicon-on-insulator (SOI) substrates.

PRIOR ART

For many years it has been recognized that SOI substrates provide better performing integrated circuits because of the reduced parasitics associated with the thin film silicon layer on which the active devices are formed. Circuits for SOI substrates may be laid out in the same manner as they are for ordinary silicon substrates. However, some benefits can be obtained, as will be described later in this application, where circuits are designed to take advantage of the SOI.

A review first of a current circuit connection and its use in a static random-access memory (SRAM) cell will be helpful in understanding the embodiments of the present invention described later.

In FIG. 1, a typical connection from, for instance, a drain region 15 of a p-channel transistor and a drain terminal 14 of a n-channel transistor is shown. First, it should be noted the n-channel transistor is formed in a p-well 11 while the p-channel transistor is formed in an n-well 12. This arrangement is for a non-SOI substrate 10. Salicide layers on the regions 14 and 15 include vias which allow the regions 14 and 15 to be connected by a metal line 20. Generally, a field oxide or trench fill with oxide forms on oxide insulation 13. This oxide provides separation between the region 14 and the well 12 and between the region 15 and well 14. Note that without the isolation provided by the oxide 13, a current path would exist between the region 14 and well 12, as shown by the arrow 21 and between the region 15 and well 11, as shown by arrow 22.

The structure of FIG. 1 is often used in static random access memory cells where cross coupled inverters, forming a bistable circuit, are used. In FIG. 2, the connection of FIG. 1 is used twice, as shown by the dotted lines 22 and 24.

DETAILED DESCRIPTION OF THE DRAWINGS

DETAILED DESCRIPTION

A connection between n-type and p-type source/drain regions formed in a silicon-on-insulator (SOI) substrate is described. In the following description, certain specific details are set forth in order to provide a thorough understanding of the present invention. It will be apparent to one skilled in the art that the present invention may be practiced without these specific details. In other instances, well known processing steps are not described in detail in order not to unnecessarily obscure the present invention.

Figure 3:
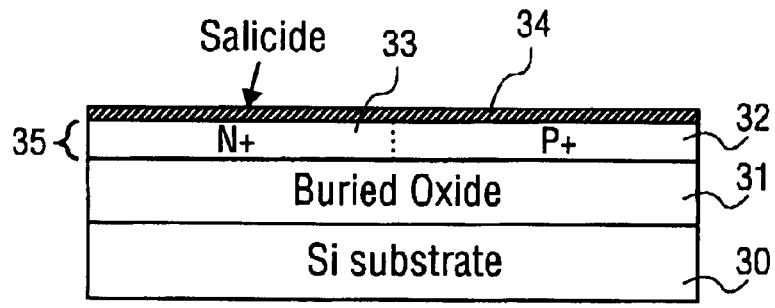
FIG. 3 is an embodiment of the present invention showing a connection between the source/drain of one transistor of a first conductivity type and the source/drain of another transistor of opposite conductivity type.

Referring first to FIG. 3, a connection in accordance with one embodiment of the present invention is illustrated. The connection is fabricated on a SOI substrate. These substrates are known in the prior art and are typically formed from a monocrystalline silicon substrate such as the substrate 30 of FIG. 3. A relatively high quality monocrystalline silicon layer 35 is formed over the substrate 30 with an intermediate oxide layer 31 disposed between the relatively thicker substrate body 30 and the thin film layer 35. Typically, the buried oxide layer 31 of FIG. 3 is a relatively high quality oxide layer grown from the substrate 30.

The SOI substrates are formed in several ways, for instance, such substrates are fabricated by growing an epitaxial layer 35 over the oxide layer 31 by using seeds from the substrate 30. Another technique is to laser anneal an amorphous or polysilicon layer deposited on the oxide layer 31 to increase the crystal size to provide a somewhat monocrystalline silicon layer. One other technique is to implant oxygen ions into a monocrystalline silicon substrate so as to form the buried oxide layer 31 while leaving a monocrystalline silicon layer 35 above the layer 31.

With the present invention, an n+ region 33 directly abuts a p+ region 32 as shown in FIG. 3. The n+ region may be a source or drain region of an n-channel transistor and the p+ region 32 may be a source or drain region of a p-channel transistor. Regions 32 and 33 are formed with the formation of their respective field-effect transistors with a standard self-aligned process, as will be discussed.

In one circuit application discussed later, the region 33 is the drain region of an n-channel transistor in an inverter, and the p+ region 32 is the drain region of a p-channel transistor in the inverter. The inverter is part of a SRAM cell, and consequently, is cross coupled with another inverter to form a bistable circuit, as will be discussed in conjunction with FIGS. 4 and 5.

A salicide layer 34 extends from the upper surface of the region 33 continuously over the upper surface of the region 32. This layer provides a conductive path between the regions 32 and 33. The layer 34 is a self-aligned silicide layer formed from, for instance, silicon and titanium or nickel, as well as other metals.

Figure 1:
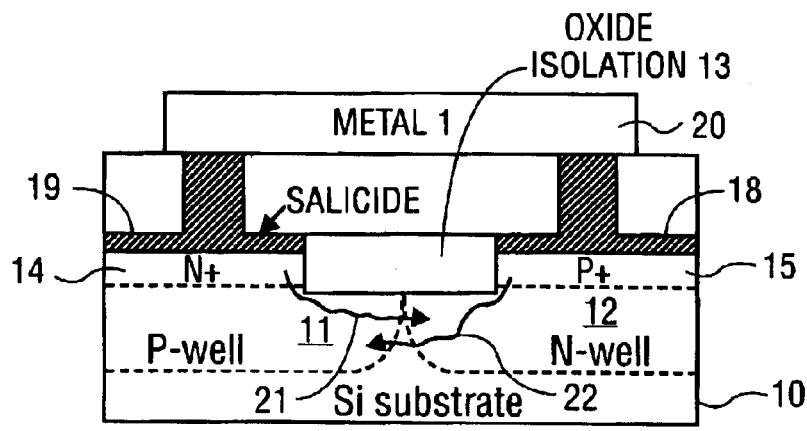
FIG. 1 is a cross sectional elevation view of a silicon substrate showing the connection between the source/drain region of one transistor of a first conductivity type and the source/drain of another transistor of opposite conductivity type.

In contrasting the structure of FIG. 3 with the structure of FIG. 1, it can be seen that the source/drain regions are closer to one another. This reduces the substrate area required for the connection. Moreover, the connection is simpler. There are no vias required, such as the vias shown in FIG. 1 used to connect the regions with a metal 20. Additionally, no metal layer 20 is required for the connection of FIG. 3 since the salicide layer 34 performs this function.

Figure 2:
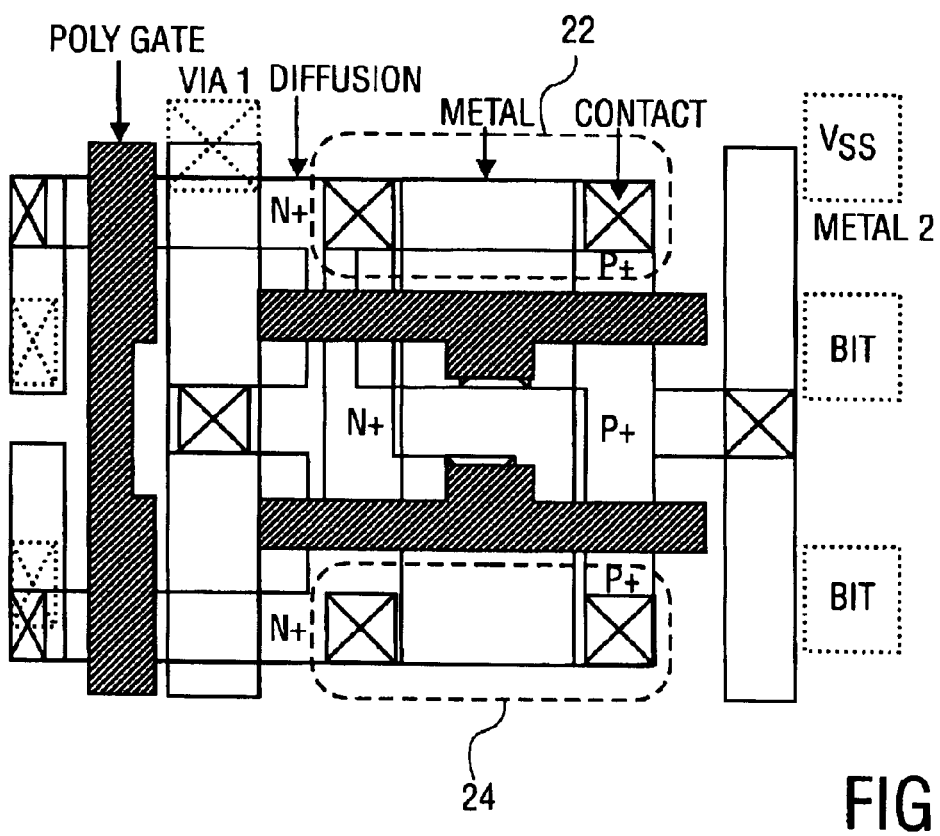
FIG. 2 is a prior art layout of a SRAM cell using the connection of FIG. 1.
Figure 4:
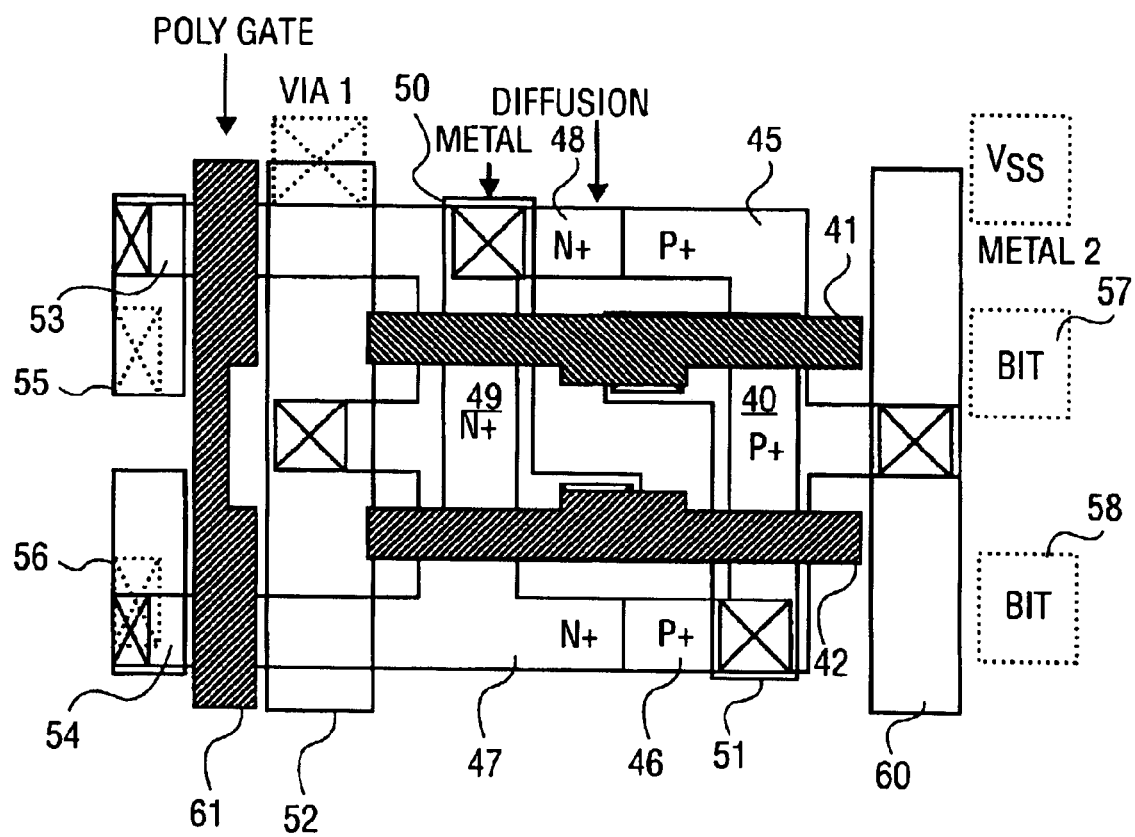
FIG. 4 shows the connection of FIG. 3 used in a layout of a six transistor SRAM cell.

The connection of FIG. 3 is used to reduce the layout area required for the SRAM cell of FIG. 2. In FIG. 4, an SRAM cell is shown which comprises cross-coupled inverters forming a bistable circuit and a pair of passgate transistors which couple the bistable circuit to bit lines. Each of the inverters comprises a series connected p-channel and n-channel field-effect transistor.

A common source region 40 for the p-channel transistors is coupled to an overlying metal (Metal 1) power line 60. The source region for one of these transistors is region 45 and for the other, region 46. The polysilicon gate structure 41 forms a gate for both transistors in one of the inverters, while the polysilicon gate structure 42 provides gates for the transistors in the other inverter. One inverter's n-channel transistor includes regions 48 and 49. The n-channel transistor for the other inverter includes region 47 and shares the n+ region 49. Region 49 is coupled through a contact to the ground line 52.

It should be noted that the p+ drain region 45 and the n+ drain region 48 for one of the inverters abut one another, as shown in FIG. 4. The same is true for the regions 46 and 47 for the other inverter. In contrast, when comparing the structure of FIG. 4 with that of FIG. 2, note that the more complex connection showed within dotted lines 23 and 24 is not used.

There is a salicide layer covering regions 45 and 48 corresponding to layer 34 of FIG. 3. Similarly, there is a salicide layer covering regions 46 and 47.

The remainder of the SRAM cell of FIG. 4 includes the passgate transistors. One passgate transistor shares the region 50 and includes the n+ region 53. The other transistor shares the region 47 and includes the n+ region 54. The gate structure 61 for these passgate transistors is, in effect, the word line allowing the selection of the cell by coupling it to the complementary bit lines. This coupling is done through the contacts 55 and 56, which connect these passgate transistors to the bit lines 57 and 58.

The cross-coupling between the inverters is done with the metal members 50 and 51. The metal member 50 contacts the n+ region 48 and the silicon member 42. Similarly, the p+ region 46, through the metal member 51, contacts the polysilicon structure 41. Note that the regions 45 and 48 are connected together by the overlying salicide not shown in FIG. 4, and similarly, the regions 46 and 47 are connected together by an overlying salicide layer.

Figure 5:
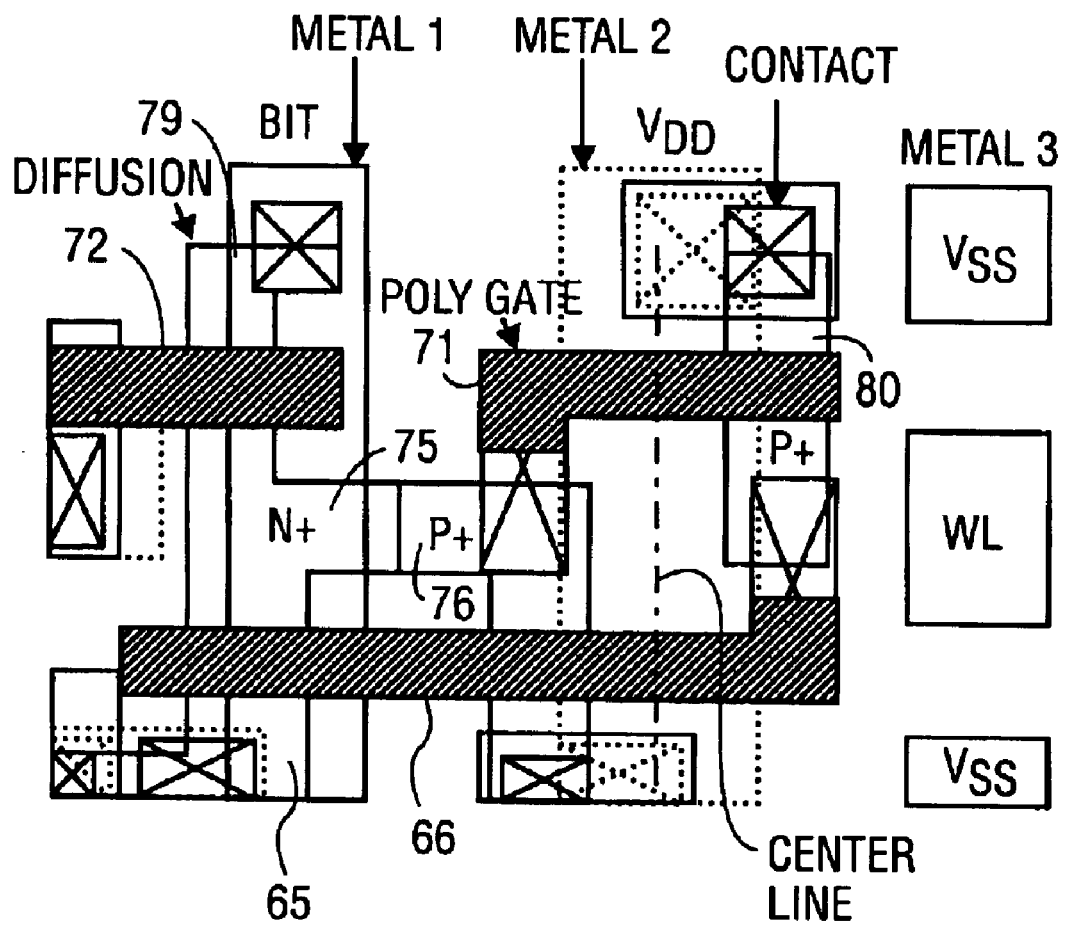
FIG. 5 shows the connection of FIG. 3 used in another layout of a partially shown six transistor SRAM cell.

In FIG. 5, another layout for an SRAM cell is shown which uses a wide layout arrangement. The cell is partially shown in FIG. 5. Again, the cell includes a pair of cross-coupled inverters forming a bistable circuit and a pair of transfer gates. The p-channel transistor of one of the inverters is shown as region 80, gate 71, and region 76. The n-channel transistor for this inverter includes the drain region 75, the gate 66, and an n+ source region 65. The passgate transistor includes the region 75, the gate (word line) 72, and the region 79, which is connected to a bit line formed from the overlying Metal 1.

Importantly, unlike the prior art wide six transistor SRAM cells, regions 75 and 76 are abutting, reducing the area needed for the cell. The corresponding regions in the other part of the cell are also abutting. A salicide layer such as shown in FIG. 3, connects these regions.

Figure 6:
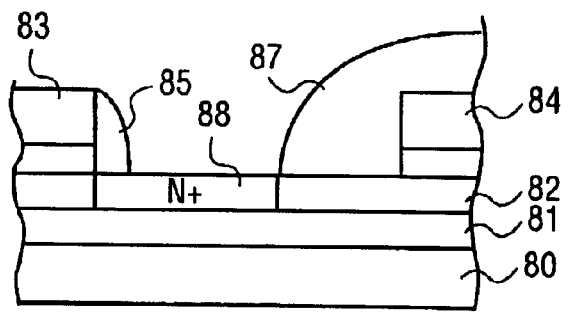
FIG. 6 is a cross-sectional elevation view of a SOI substrate where a first doped region is formed.

Referring now to FIG. 6, a silicon substrate 80 is illustrated having a buried oxide layer 81 and a monocrystalline silicon layer 82. Part of two polysilicon gates 80 and 84 are shown formed on the SOI substrate, each of which is insulated from the layer 82. Sidewall spacers 85 are formed on the opposite sides of gate 83. These sidewall spacers are often used to form more lightly doped source and drain regions adjacent to the gate. The spacers also permit the self-aligned silicide to form on the upper surface of the gate, and on the source and drain regions without shorting since they are formed from silicon dioxide or silicon nitride.

A photoresist layer 87 covers the gate 84 and part of the substrate adjacent to the gate 84. A dopant such as arsenic is diffused into the layer 82 adjacent to the gate 84 to form a source or drain region 88. The dopant, for instance, may be ion implanted in a commonly used self-aligned process. (The forming of the more likely doped regions which is typically done before the spacers 85 are formed, is not shown in the figures.)

Figure 7:
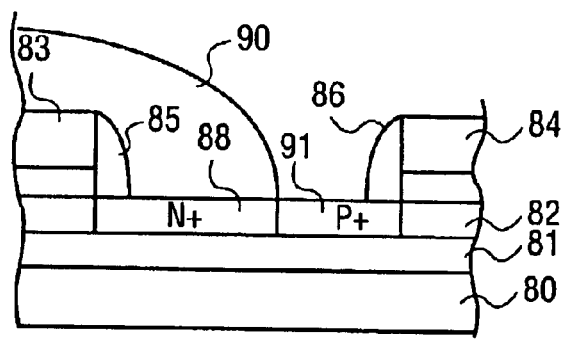
FIG. 7 illustrates the substrate of FIG. 6 after an additional masking step and an additional doping step.

Now, another masking step is used to form the photoresist layer 90 so as to cover the region 88 and gate 83, leaving exposed the substrate region abutting region 88. Now, a p-type dopant, such as boron or phosphorous, is introduced into the silicon layer 81 forming a source or drain region 91, in alignment with the gate and a spacer 86. Note from FIG. 7, that the region 88 abuts the region 91, that is, they are adjacent or abutting, there being no undoped region between them.

Figure 8:
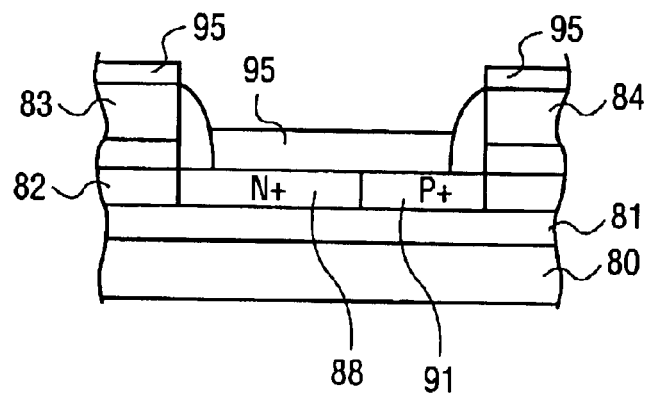
FIG. 8 illustrates the substrate of FIG. 7 after a salicide layer has been formed.

Next, as shown in FIG. 8, after the photoresist 90 is removed, a silicide layer 95 is formed using, for instance, titanium or nickel. This layer is self-aligned in that it only forms on the silicon. As mentioned, this layer is referred to as a salicide since it is a self-aligning silicide. Since the layer 95 only forms on silicon, it does not form on the spacers adjacent to the gates 83 and 84, and consequently the gates are not shorted to the source/drain regions. As shown in FIG. 8, the layer 95 interconnents the regions 88 and 91.

Thus, a connection between two regions of opposite conductivity type has been described where the regions abut, and an overlying salicide layer interconnects the regions. The connection is particularly useful for SRAM cells.

What is claimed is:

1. An integrated circuit comprising:
   a substrate having an silicon-on-insulator (SOI) surface containing active devices;
   at least two of the active devices being a first and a second field-effect transistor, each having a source and drain region of opposite conductivity type formed in the SOI surface, where a region of the first transistor directly abuts a region of the second transistor; and
   a salicide layer, for providing a conductive path between the directly abutting regions of the first and second transistor, extending continuously from an upper surface of the region of the first transistor to an upper surface of the region of the second transistor; and
   a metal member that contacts only one of the directly abutting regions of the first and second transistor.

2. The integrated circuit defined by claim 1, wherein the abutting regions are a p-type drain region and an n-type drain region.

3. The integrated circuit defined by claim 1, wherein the insulator is silicon dioxide.

4. The integrated circuit defined by claim 2, wherein the insulator is silicon dioxide.

5. The integrated circuit defined by claim 1, wherein the salicide is formed by using titanium.

6. The integrated circuit defined by claim 4, wherein the salicide is formed using nickel.

7. A circuit formed on a silicon-on-insulator (SQL) substrate comprising:
   a first transistor having a source and drain region of a first conductivity type formed in the SOI substrate;
   a second transistor having a source and drain region of a second conductivity type formed in the SOI substrate; and
   one of the source and drain regions of the first transistor and one of the source and drain regions of the second transistor directly abutting one another with a salicide layer, for providing a conductive path between the abutting regions of the first and second transistor, extending continuously between upper surfaces of the abutting regions, a metal member that contacts only one of the directly abutting regions of the first and second transistor.

8. The circuit defined by claim 7, wherein the abutting regions are a p-type drain region and an n-type drain region.

9. The circuit defined by claim 8, wherein the insulator is silicon dioxide.

10. The circuit defined by claim 9, wherein the salicide comprises either nickel or titanium.

11. An integrated circuit comprising:

a silicon-on-insulator substrate;

a first and a second inverter formed on the substrate which are cross coupled forming a bistable circuit;

each inverter including a p-channel and an n-channel transistor connected in series such that a p region and an n region in each inverter directly abut one another with a continuous silicide layer, for providing a conductive path between the abutting p and n regions, extending from an upper surface of the p region to an upper surface of the n region in each inverter; and a metal member that contacts only one of the abutting p and n regions.

12. The integrated circuit defined by claim 11, wherein the insulator of the SOI substrate is silicon dioxide.

13. The integrated circuit defined by claim 12, wherein the bistable circuit is incorporated into a six transistor static random access memory cell.

14. A method comprising:

forming a first and a second spaced apart gates insulated from, and formed on, a silicon-on-insulator (SOI) substrate;

forming a first doped region of a first conductivity type adjacent to one of the gates in the SOI substrate;

forming a second doped region of a second conductivity type adjacent to the other gate, the first and second regions directly abutting one another; and forming a continuous salicide layer on an upper surface of the doped regions interconnecting the doped and forming a metal member on only one of the doped regions.

15. The method defined by claim 14, wherein the doped regions are formed with ion implantation.

16. The method defined by claim 14, wherein the salicide layer is formed using titanium.

17. The method defined by claim 14, wherein the salicide layer is formed using nickel.

* * * * *

UNITED STATES PATENT AND TRADEMARK OFFICE
CERTIFICATE OF CORRECTION

PATENT NO. : 6,762,464 B2
DATED : July 13, 2004
INVENTOR(S) : Webb et al.

It is certified that error appears in the above-identified patent and that said Letters Patent is hereby corrected as shown below:

Column 4,
Line 22, delete "interconnents" and insert -- interconnects --.
Line 54, delete "(SQL)" and insert -- (SOI) --.

Column 6,
Line 14, insert -- regions; -- after the second occurrence of the word "doped".

Signed and Sealed this

Seventh Day of December, 2004

JON W. DUDAS
*Director of the United States Patent and Trademark Office*